(12) United States Patent
Amihai et al.

(10) Patent No.: US 12,639,565 B2
(45) Date of Patent: May 26, 2026

(54) SYSTEM FOR MONITORING A CIRCUIT BREAKER

(71) Applicant: ABB Schweiz AG, Baden (CH)

(72) Inventors: Ido Amihai, Bensheim (DE); Aydin Boyaci, Karlsruhe (DE); Ralf Gitzel, Mannheim (DE)

(73) Assignee: ABB Schweiz AG, Baden (CH)

( * ) Notice: Subject to any disclaimer, the term of this patent is extended or adjusted under 35 U.S.C. 154(b) by 1212 days.

(21) Appl. No.: 17/527,254

(22) Filed: Nov. 16, 2021

(65) Prior Publication Data

US 2022/0156586 A1 May 19, 2022

(30) Foreign Application Priority Data

Nov. 17, 2020 (EP) .................................... 20208183

(51) Int. Cl.
*G06N 3/08* (2023.01)
*G01R 31/327* (2006.01)
*H01H 71/04* (2006.01)

(52) U.S. Cl.
CPC ........... *G06N 3/08* (2013.01); *G01R 31/3274* (2013.01); *H01H 2071/044* (2013.01)

(58) Field of Classification Search
CPC ......... H01H 2071/044; H01H 2071/00; H01H 71/00; H01H 71/04; G01R 31/3274; G01R 31/00; G01R 31/32; G01R 31/327; G06N 3/08; G06N 3/00
USPC ....................................................... 200/19.01
See application file for complete search history.

(56) References Cited

U.S. PATENT DOCUMENTS

| | | | |
|---|---|---|---|
| 2001/0048375 A1 | 12/2001 | Maruyama et al. | |
| 2009/0113049 A1 | 4/2009 | Nasle et al. | |
| 2017/0047181 A1* | 2/2017 | Yang .................... | H01H 3/3005 |

FOREIGN PATENT DOCUMENTS

| | | |
|---|---|---|
| CN | 106291351 A | 1/2017 |
| CN | 107064786 A | 8/2017 |
| CN | 107490760 A | 12/2017 |
| CN | 108896292 A | 11/2018 |
| CN | 109556845 A | 4/2019 |

(Continued)

OTHER PUBLICATIONS

Baur et al., "Deep Autoencoding Models for Unsupervised Anomaly Segmentation in Brain MR Images," *International MICCAI Brainlesion Workshop, Springer*, pp. 161-169 (2018).

(Continued)

*Primary Examiner* — Anthony R Jimenez
(74) *Attorney, Agent, or Firm* — Fitch Even Tabin & Flannery LLP

(57) ABSTRACT

A system for monitoring a circuit breaker includes at least one sensor and a processor. The at least one sensor is configured to be located and utilized to obtain at least one time series sensor data of at least one first part an operational circuit breaker. The at least one sensor is configured to provide the at least one time series sensor data of the at least one first part of the operational circuit breaker to the processor. The processor is configured to determine that at least one second part of the operational circuit breaker is operating correctly or has a fault, where the determination includes analysis of the at least one time series sensor data of the at least one first part of the operational circuit breaker by a trained neural network implemented by the processor.

15 Claims, 3 Drawing Sheets

(56) References Cited

FOREIGN PATENT DOCUMENTS

| | | | |
|---|---|---|---|
| CN | 110398348 | A | 11/2019 |
| CN | 111198323 | A | 5/2020 |
| CN | 114545217 | A | 5/2022 |
| CN | 221571661 | U * | 8/2024 |
| KR | 10-1382301 | B1 | 4/2014 |
| RU | 2580183 | C1 | 4/2016 |

OTHER PUBLICATIONS

Cai et al., "Anomaly Detection in Thermal Images Using Deep Neural Networks," *IEEE International Conference on Image Processing, ICIP 2017*, pp. 2299-2303 (Sep. 17-20, 2017).

Chow et al., "Anomaly Detection of Defects on Concrete Structures with the Convolutional Autoencoder," abstract, *Advanced Engineering Informatics*, 45: 101105 (Aug. 2020).

Sun et al., "Learning Sparse Representation With Variational Auto-Encoder for Anomaly Detection," *IEEE Access*, 6: 33353-33361 (Jun. 15, 2018).

European Patent Office, Extended European Search Report in European Patent Application No. 20208183.2, 10 pp. (Apr. 21, 2021).

China National Intellectual Property Administration, Office Action in Chinese Patent Application No. 202111347325.3, 7 pp. (Sep. 11, 2025).

* cited by examiner

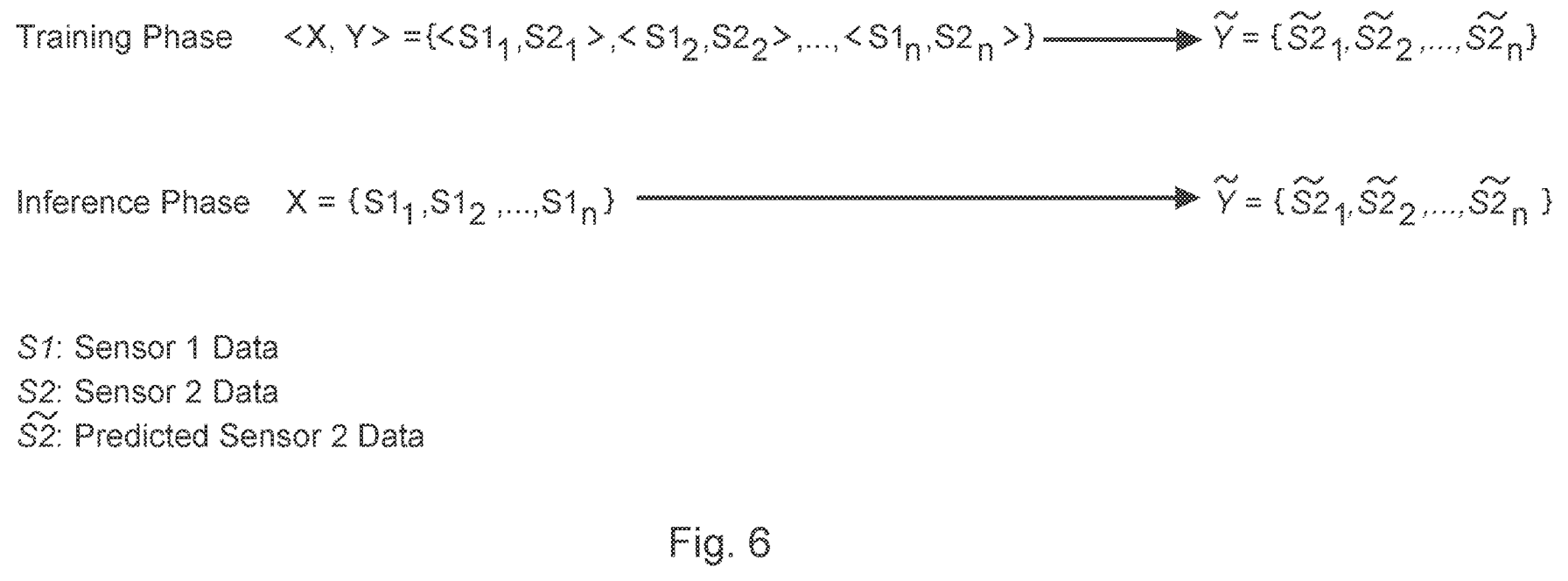

Training Phase    $\langle X, Y \rangle = \{\langle S1_1, S2_1 \rangle, \langle S1_2, S2_2 \rangle, ..., \langle S1_n, S2_n \rangle\}$ → $\tilde{Y} = \{\tilde{S2}_1, \tilde{S2}_2, ..., \tilde{S2}_n\}$ Inference Phase    $X = \{S1_1, S1_2, ..., S1_n\}$ → $\tilde{Y} = \{\tilde{S2}_1, \tilde{S2}_2, ..., \tilde{S2}_n\}$ S1: Sensor 1 Data
S2: Sensor 2 Data
$\tilde{S2}$: Predicted Sensor 2 Data

Fig. 6

SYSTEM FOR MONITORING A CIRCUIT BREAKER

CROSS-REFERENCE TO PRIOR APPLICATION

Priority is claimed to European Patent Application No. EP 20 208 183.2, filed on Nov. 17, 2020, the entire disclosure of which is hereby incorporated by reference herein.

FIELD

One or more embodiments of the present invention may relate to a system for monitoring a circuit breaker, a system for monitoring a two or three phase switchgear or control gear, a method for monitoring a circuit breaker, a system for training a neural network for monitoring a circuit breaker, and a method for training a neural network for monitoring a circuit breaker.

BACKGROUND

Problems with industrial assets, such as circuit breakers, are often measurable using time-series sensor data. However, extracting the relevant information out of the signal is often difficult, particularly when the signal to noise ratio is low. It is also not practical for a human to continuously monitor such signals, and it can be difficult to obtain sensor data from the required parts of such assets in the field.

There is a need to address these problems.

SUMMARY

One or more embodiments of the present invention may provide a system for monitoring a circuit breaker. The system may include: at least one sensor; and a processor, wherein the at least one sensor is configured to be located and utilized to obtain at least one time series sensor data of at least one first part an operational circuit breaker, wherein the at least one sensor is configured to provide the at least one time series sensor data of the at least one first part of the operational circuit breaker to the processor, and wherein the processor is configured to determine that at least one second part of the operational circuit breaker is operating correctly or that the at least one second part of the operational circuit breaker has a fault, wherein the determination comprises analysis of the at least one time series sensor data of the at least one first part of the operational circuit breaker by a trained neural network implemented by the processor.

One or more embodiments of the present invention may provide a method for monitoring a circuit breaker. The method may include: utilizing at least one sensor located to obtain at least one time series sensor data of at least one first part an operational circuit breaker; providing the at least one time series sensor data of the at least one first part of the operational circuit breaker to a processor; and determining by the processor that at least one second part of the operational circuit breaker is operating correctly or that the at least one second part of the operational circuit breaker has a fault, wherein the determining comprises analysing the at least one time series sensor data of the at least one first part of the operational circuit breaker by a trained neural network implemented by the processor.

One or more embodiments of the present invention may provide a system for training a neural network for monitoring a circuit breaker. The system may include: at least one first sensor; at least one second sensor; and a processor, wherein the at least one first sensor is configured to be located and utilized to obtain at least one time series sensor data of at least one first part of a calibration circuit breaker, wherein the at least one first sensor is configured to provide the at least one time series sensor data of the at least one first part of the calibration circuit breaker to the processor, wherein the at least one second sensor is configured to be located and utilized to obtain at least one time series sensor data of at least one second part of the calibration circuit breaker, wherein the at least one second sensor is configured to provide the at least one time series sensor data of the at least one second part of the calibration circuit breaker to the processor, wherein the processor is configured to train the neural network, wherein the training of the neural network comprises utilization of the at least one time series sensor data of the at least one first part of the calibration circuit breaker and the at least one sensor data of the at least one second part of the calibration circuit breaker, wherein the trained neural network is configured to determine that the at least one second part of an operational circuit breaker is operating correctly or that the at least one second part of the operational circuit breaker has a fault on the basis of analysis of at least one time series sensor data of the at least one first part of the operational circuit breaker, and wherein the calibration circuit breaker is the same type or model as the operational circuit breaker.

One or more embodiments of the present invention may provide a method for training a neural network for monitoring a circuit breaker. The method may include: utilizing at least one first sensor located to obtain at least one time series sensor data of at least one first part of a calibration circuit breaker; providing the at least one time series sensor data of the at least one first part of the calibration circuit breaker to a processor; utilizing at least one second sensor located to obtain at least one time series sensor data of at least one second part of the calibration circuit breaker; providing the at least one time series sensor data of the at least one second of the calibration circuit breaker to the processor; and training by the processor the neural network, wherein: the training of the neural network comprises utilizing the at least one time series sensor data of the at least one first part of the calibration circuit breaker and at least one sensor data of the at least one second part of the calibration circuit breaker, the trained neural network is configured to determine that the at least one second part of an operational circuit breaker is operating correctly or that the at least one second part of the operational circuit breaker has a fault on the basis of analysis of at least one time series sensor data of the at least one first part of the operational circuit breaker, and the calibration circuit breaker is a same type or model as the operational circuit breaker.

Therefore, it may be advantageous to have an improved technique to monitor an asset such as a circuit breaker.

An object of one or more embodiments of the present invention may be solved with the subject matter of the independent claims, wherein further embodiments are incorporated in the dependent claims.

BRIEF DESCRIPTION OF THE DRAWINGS

One or more embodiments of the present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 6 shows a workflow for training of the neural network.

DETAILED DESCRIPTION

Figure 1:
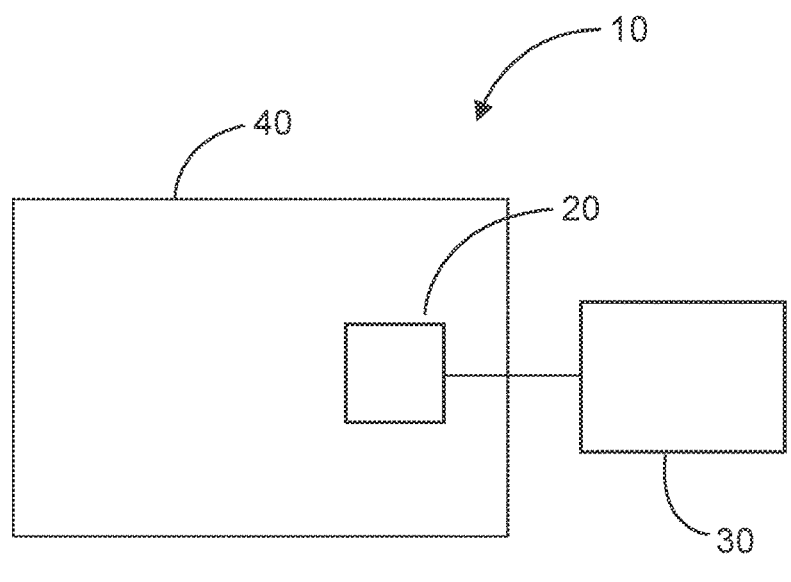
FIG. 1 shows a schematic representation of an exemplar system for monitoring a circuit breaker.

In a first aspect, there is provided a system for monitoring a circuit breaker, the system comprising:

at least one sensor; and a processing unit.

The at least one sensor is configured to be located and utilized to obtain at least one time series sensor data of at least one first part an operational circuit breaker. The at least one sensor is configured to provide the at least one time series sensor data of the at least one first part of the operational circuit breaker to the processing unit. The processing unit is configured to determine that at least one second part of the operational circuit breaker is operating correctly or that the at least one second part of the operational circuit breaker has a fault. The determination comprises analysis of the at least one time series sensor data of the at least one first part of the operational circuit breaker by a trained neural network implemented by the processing unit.

In an example, the neural network was trained on the basis of at least one time series sensor data of the at least one first part of a calibration circuit breaker where the at least first part of the calibration circuit breaker was operating correctly. The neural network was also trained on the basis of at least one time series sensor data of the at least one second part of the calibration circuit breaker where the at least one second part of the calibration circuit breaker was operating correctly. The calibration circuit breaker was the same type or model as the operational circuit breaker.

In an example, the at least one time series sensor data of the at least one first part of the calibration circuit breaker was acquired at the same time as the at least one time series sensor data of the at least one second part of the calibration circuit breaker.

In an example, at least one sensor utilized to obtain the at least one time series sensor data of the at least one first part of the calibration circuit breaker was the same type or model as the at least one sensor utilized to obtain the at least one time series sensor data of the at least one first part of the operational circuit breaker.

In an example, at least one sensor utilized to obtain the at least one time series sensor data of the at least one first part of the calibration circuit breaker was located at the same or equivalent at least one location as the at least one sensor utilized to obtain the at least one time series sensor data of the at least one first part of the operational circuit breaker.

In an example, the trained neural network is configured to determine at least one synthetic time series sensor data of the at least one second part of the operational circuit breaker. The determination of the at least one synthetic time series sensor data comprises the analysis of the at least one time series sensor data of the at least one first part of the operational circuit breaker by the trained neural network, The determination that the at least one second part of the operational circuit breaker is operating correctly or that the at least one second part of the operational circuit breaker has a fault can then comprise a comparison of the at least one synthetic time series sensor data of the at least one second part of the operational circuit breaker with baseline saved data.

In an example, the baseline saved data comprises at least one time series sensor data of the at least one second part of a circuit breaker where the at least one second part of the circuit breaker was operating correctly.

In an example, the baseline saved data comprises at least some of the at least one time series sensor data of the at least one second part of the calibration circuit breaker used in training the neural network and/or at least one synthetic time series sensor data of the at least one second part of the calibration circuit breaker generated by the neural network from at least some of the at least one time series sensor data of the at least one first part of the calibration circuit breaker.

In an example, the processing unit is configured to determine that the at least one second part of the operational circuit breaker has a fault on the basis that a distance metric between the at least one synthetic time series sensor data of the at least one second part of the operational circuit breaker and baseline saved data is equal to or greater than a threshold value.

In an example, the system comprises an output unit configured to output information indicating that the at least one second part of the operational circuit breaker has a fault.

In an example, the neural network comprises a sequence to sequence model.

In a second aspect, there is provided a system for monitoring a two or three phase switchgear or controlgear, the system comprising two or three systems according to the first aspect, one for a circuit breaker of each of the two or three phases.

In a third aspect, there is provided a method for monitoring a circuit breaker, the system comprising:

a) utilizing at least one sensor located to obtain at least one time series sensor data of at least one first part an operational circuit breaker;

b) providing the at least one time series sensor data of the at least one first part of the operational circuit breaker to a processing unit; and c) determining by the processing unit that at least one second part of the operational circuit breaker is operating correctly or that the at least one second part of the operational circuit breaker has a fault, wherein the determining comprises analysing the at least one time series sensor data of the at least one first part of the operational circuit breaker by a trained neural network implemented by the processing unit.

In a fourth aspect, there is provided a system for training a neural network for monitoring a circuit breaker, the system comprising:

at least one first sensor;

at least one second sensor; and a processing unit.

The at least one first sensor is configured to be located and utilized to obtain at least one time series sensor data of at least one first part of a calibration circuit breaker. The at least one first sensor is configured to provide the at least one time series sensor data of the at least one first part of the calibration circuit breaker to the processing unit. The at least one second sensor is configured to be located and utilized to obtain at least one time series sensor data of at least one second part of the calibration circuit breaker. The at least one second sensor is configured to provide the at least one time series sensor data of the at least one second of the calibration circuit breaker to the processing unit. The processing unit is configured to train a neural network. The training of the neural network comprises utilization of the at least one time series sensor data of the at least one first part of the calibration circuit breaker and the at least one sensor data of the at least one second part of the calibration circuit breaker. The trained neural network is configured to determine that the at least one second part of an operational circuit breaker is operating correctly or that the at least one second part of the operational circuit breaker has a fault on the basis of analysis of at least one time series sensor data of the at least one first part of the operational circuit breaker, for the calibration circuit breaker that is the same type or model as the operational circuit breaker.

In a fifth aspect, there is provided a method for training a neural network for monitoring a circuit breaker, the method comprising:

a1) utilizing at least one first sensor located to obtain at least one time series sensor data of at least one first part of a calibration circuit breaker;

b1) providing the at least one time series sensor data of the at least one first part of the calibration circuit breaker to a processing unit;

c1) utilizing at least one second sensor located to obtain at least one time series sensor data of at least one second part of the calibration circuit breaker;

d1) providing the at least one time series sensor data of the at least one second of the calibration circuit breaker to the processing unit; and e1) training by the processing unit a neural network, wherein the training of the neural network comprises utilizing the at least one time series sensor data of the at least one first part of the calibration circuit breaker and the at least one sensor data of the at least one second part of the calibration circuit breaker, and wherein the trained neural network is configured to determine that the at least one second part of an operational circuit breaker is operating correctly or that the at least one second part of the operational circuit breaker has a fault on the basis of analysis of at least one time series sensor data of the at least one first part of the operational circuit breaker, and wherein the calibration circuit breaker is the same type or model as the operational circuit breaker.

The above aspects and examples will become apparent from and be elucidated with reference to the embodiments described hereinafter.

FIG. 1 shows an example of a system 10 for monitoring a circuit breaker. The system comprises at least one sensor 20, and a processing unit 30. The at least one sensor is configured to be located and utilized to obtain at least one time series sensor data of at least one first part an operational circuit breaker 40. The at least one sensor is configured to provide the at least one time series sensor data of the at least one first part of the operational circuit breaker to the processing unit. The processing unit is configured to determine that at least one second part of the operational circuit breaker is operating correctly or that the at least one second part of the operational circuit breaker has a fault. The determination of correct or faulty operation comprises analysis of the at least one time series sensor data of the at least one first part of the operational circuit breaker by a trained neural network implemented by the processing unit.

Here there can for example be one time series of data from one sensor or two time series of data running parallel in time acquired from two sensors etc.

In an example, the at least one first part of the operational circuit breaker is a main shaft of the circuit breaker.

In an example, the at least one first sensor utilized to obtain the at least one time series sensor data of the at least one first part of the operational circuit breaker comprises one or more of: acceleration sensor; main shaft angle sensor.

In an example, the at least one second part of the operational circuit breaker is a moveable contact and/or pushrod of the circuit breaker.

According to an example, the neural network was trained on the basis of at least one time series sensor data of the at least one first part of a calibration circuit breaker. This data was acquired when the at least first part of the calibration circuit breaker was operating correctly. The neural network was also trained on the basis of at least one time series sensor data of the at least one second part of the calibration circuit breaker. This data was acquired when the at least one second part of the calibration circuit breaker was operating correctly. The calibration circuit breaker is the same type or model as the operational circuit breaker.

Here there can for example be one time series of data from one sensor or two time series of data running parallel in time acquired from two sensors etc. there can also be numerous examples of such data, acquired over a period of time for numerous operations of the calibration circuit breaker to build up a database of training data, where the calibration circuit breaker was operating correctly in order to train the neural network. Only "healthy" data need be used to train the neural network, where the circuit breaker is operating correctly.

In an example, the at least one first part of the calibration circuit breaker is a main shaft of the circuit breaker.

In an example, the at least one first sensor utilized to obtain the at least one time series sensor data of the at least one first part of the calibration circuit breaker comprises one or more of: acceleration sensor; main shaft angle sensor.

In an example, the at least one second part of the calibration circuit breaker is a moveable contact and/or pushrod of the circuit breaker.

In an example, at least one second sensor 70 utilized to obtain the at least one time series sensor data of the at least one second part of the calibration circuit breaker comprises one or more of: position sensor; velocity sensor.

According to an example, the at least one time series sensor data of the at least one first part of the calibration circuit breaker was acquired at the same time as the at least one time series sensor data of the at least one second part of the calibration circuit breaker.

According to an example, at least one sensor 20, 60 utilized to obtain the at least one time series sensor data of the at least one first part of the calibration circuit breaker was the same type or model as the at least one sensor 20 utilized to obtain the at least one time series sensor data of the at least one first part of the operational circuit breaker.

According to an example, at least one sensor utilized to obtain the at least one time series sensor data of the at least one first part of the calibration circuit breaker was located at the same or equivalent at least one location as the at least one sensor utilized to obtain the at least one time series sensor data of the at least one first part of the operational circuit breaker.

According to an example, the trained neural network is configured to determine at least one synthetic time series sensor data of the at least one second part of the operational circuit breaker. The determination of the synthetic data comprises the analysis of the at least one time series sensor data of the at least one first part of the operational circuit breaker by the trained neural network. The determination that the at least one second part of the operational circuit breaker is operating correctly or that the at least one second part of the operational circuit breaker has a fault can then comprise a comparison of the at least one synthetic time series sensor data of the at least one second part of the operational circuit breaker with baseline saved data.

According to an example, the baseline saved data comprises at least one time series sensor data of the at least one second part of a circuit breaker where the at least one second part of the circuit breaker was operating correctly.

According to an example the baseline saved data comprises at least some of the at least one time series sensor data of the at least one second part of the calibration circuit breaker used in training the neural network.

According to an example, the baseline saved data comprises at least one synthetic time series sensor data of the at least one second part of the calibration circuit breaker generated by the neural network from at least some of the at least one time series sensor data of the at least one first part of the calibration circuit breaker.

Thus the baseline data used to compare the spectrum generated by the neural network for the operational circuit breaker, that is what an at least one second sensor would be expected to have generated for the operational circuit breaker on the basis of real input data from at least one first sensor, can be compared against the actual data used to train the neural network and/or synthetic data generated by the neural network. Thus the time series sensor data acquired by the at least one second sensor used in training the neural network can be used as the baseline data, where this data was for a correctly operating calibration circuit breaker. Additionally or alternatively the baseline data can be synthetic time series data generated by the neural network that is the expected time series data that would have been provided for the at least one second sensor, but where time series sensor data from the at least one first sensor was used as input to the neural network (when the neural network was already trained) and where this input sensor data was for a calibration circuit breaker that was operating correctly.

According to an example, the processing unit is configured to determine that the at least one second part of the operational circuit breaker has a fault on the basis that a distance metric between the at least one synthetic time series sensor data of the at least one second part of the operational circuit breaker and baseline saved data is equal to or greater than a threshold value.

In an example, the distance metric comprises a root mean squared error.

In an example, the processing unit is configured to determine that the at least one second part of the operational circuit breaker is operating correctly on the basis that a distance metric between the at least one synthetic time series sensor data of the at least one second part of the operational circuit breaker and baseline saved data is less than a threshold value.

According to an example, the system comprises an output unit configured to output information indicating that the at least one second part of the operational circuit breaker has a fault.

According to an example, the neural network comprises a sequence to sequence model.

Figure 2:
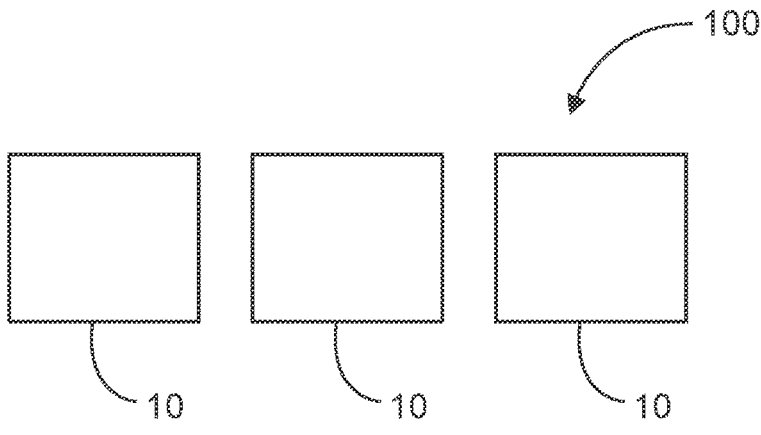
FIG. 2 shows a schematic representation of an exemplar system for monitoring a two or three phase switchgear or control gear.

FIG. 2 shows an example of a system 100 for monitoring a two or three phase switchgear or controlgear. The system 100 comprises two or three systems 10 as described with respect to FIG. 1, one for a circuit breaker of each of the two or three phases, however one processing unit can process the sensor data from all the sensors for each phase.

Figure 3:
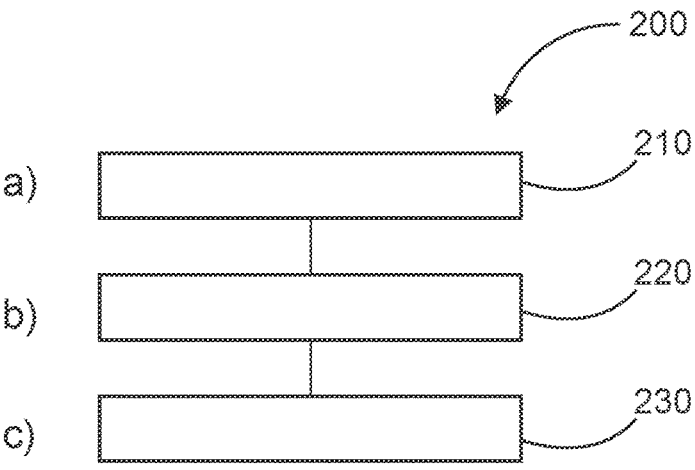
FIG. 3 shows a method for monitoring a circuit breaker.

FIG. 3 shows a method 200 for monitoring a circuit breaker in its basic steps. The method comprises:

in a utilizing step 210, also referred to as step a), utilizing at least one sensor located to obtain at least one time series sensor data of at least one first part an operational circuit breaker;

in a providing step 220, also referred to as step b), providing the at least one time series sensor data of the at least one first part of the operational circuit breaker to a processing unit; and in a determining step 230, also referred to as step c), determining by the processing unit that at least one second part of the operational circuit breaker is operating correctly or that the at least one second part of the operational circuit breaker has a fault, wherein the determining comprises analysing the at least one time series sensor data of the at least one first part of the operational circuit breaker by a trained neural network implemented by the processing unit.

In an example, the neural network was trained on the basis of at least one time series sensor data of the at least one first part of a calibration circuit breaker where the at least first part of the calibration circuit breaker was operating correctly and at least one time series sensor data of the at least one second part of the calibration circuit breaker where the at least one second part of the calibration circuit breaker was operating. The calibration circuit breaker used was the same type or model as the operational circuit breaker.

In an example, the at least one time series sensor data of the at least one first part of the calibration circuit breaker was acquired at the same time as the at least one time series sensor data of the at least one second part of the calibration circuit breaker In an example, at least one sensor utilized to obtain the at least one time series sensor data of the at least one first part of the calibration circuit breaker was the same type or model as the at least one sensor utilized to obtain the at least one time series sensor data of the at least one first part of the operational circuit breaker.

In an example, at least one sensor utilized to obtain the at least one time series sensor data of the at least one first part of the calibration circuit breaker was located at the same or equivalent at least one location as the at least one sensor utilized to obtain the at least one time series sensor data of the at least one first part of the operational circuit breaker.

In an example, the method comprises determining by the trained neural network at least one synthetic time series sensor data of the at least one second part of the operational circuit breaker. The determining comprises the analysing of the at least one time series sensor data of the at least one first part of the operational circuit breaker by the trained neural network. The determining that the at least one second part of the operational circuit breaker is operating correctly or that the at least one second part of the operational circuit breaker has a fault can then comprise comparing the at least one synthetic time series sensor data of the at least one second part of the operational circuit breaker with baseline saved data.

In an example, the baseline saved data comprises at least one time series sensor data of the at least one second part of a circuit breaker where the at least one second part of the circuit breaker was operating correctly.

In an example, the baseline saved data comprises at least some of the at least one time series sensor data of the at least one second part of the calibration circuit breaker used in training the neural network and/or at least one synthetic time series sensor data of the at least one second part of the calibration circuit breaker generated by the neural network from at least some of the at least one time series sensor data of the at least one first part of the calibration circuit breaker.

In an example, the method comprises determining by the processing unit that the at least one second part of the operational circuit breaker has a fault on the basis that a distance metric between the at least one synthetic time series sensor data of the at least one second part of the operational circuit breaker and baseline saved data is equal to or greater than a threshold value.

In an example, the distance metric comprises a root mean squared error.

In an example, the method comprises determining by the processing unit that the at least one second part of the operational circuit breaker is operating correctly on the basis that a distance metric between the at least one synthetic time series sensor data of the at least one second part of the operational circuit breaker and baseline saved data is less than a threshold value.

The threshold value for determining a fault and determining correct operation can be the same or different. Thus, there can be a "black or white" of correct operation or fault in which case remedial action is required and if necessary the circuit breaker immediately taken out of operation. Or there can be "black or grey or white", in that the metric can be below one threshold and the operation be correct or above another threshold and the operation be faulty (and remedial action is required) or between the two thresholds and the circuit breaker can continue to operate but could be monitored more closely or scheduled for a service in the near future.

In an example, the method comprises outputting by an output unit information indicating that the at least one second part of the operational circuit breaker has a fault.

In an example, the neural network comprises a sequence to sequence model.

Figure 4:
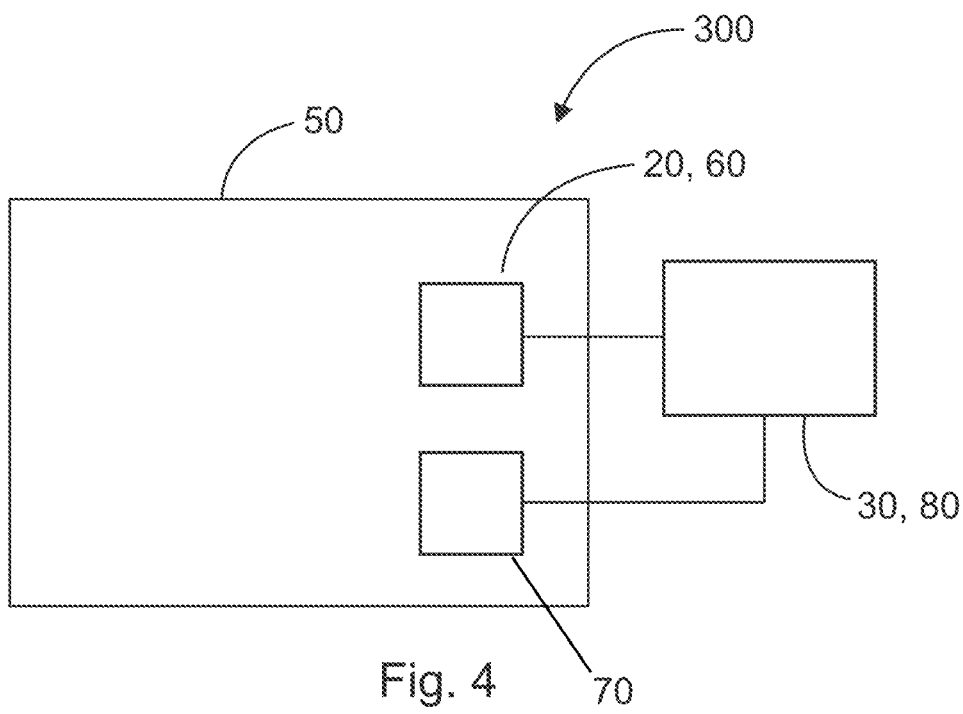
FIG. 4 shows a schematic representation of an exemplar system for training a neural network for monitoring a circuit breaker.

FIG. 4 shows an example of a system 300 for training a neural network for monitoring a circuit breaker. The system comprises at least one first sensor 20, 60, at least one second sensor 70, and a processing unit 30, 80. The at least one first sensor is configured to be located and utilized to obtain at least one time series sensor data of at least one first part of a calibration circuit breaker 50. The at least one first sensor is configured to provide the at least one time series sensor data of the at least one first part of the calibration circuit breaker to the processing unit. The at least one second sensor is configured to be located and utilized to obtain at least one time series sensor data of at least one second part of the calibration circuit breaker. The at least one second sensor is configured to provide the at least one time series sensor data of the at least one second of the calibration circuit breaker to the processing unit. The processing unit is configured to train a neural network. The training of the neural network comprises utilization of the at least one time series sensor data of the at least one first part of the calibration circuit breaker and the at least one sensor data of the at least one second part of the calibration circuit breaker. The trained neural network is then configured to determine that the at least one second part of an operational circuit breaker is operating correctly or that the at least one second part of the operational circuit breaker has a fault on the basis of analysis of at least one time series sensor data of the at least one first part of the operational circuit breaker. The calibration circuit breaker is the same type or model as the operational circuit breaker.

In an example, the at least one first part of the operational circuit breaker is a main shaft of the circuit breaker.

In an example, the at least one first sensor utilized to obtain the at least one time series sensor data of the at least one first part of the operational circuit breaker comprises one or more of: acceleration sensor; main shaft angle sensor.

In an example, the at least one second part of the operational circuit breaker is a moveable contact and/or pushrod of the circuit breaker.

In an example, the at least one first part of the calibration circuit breaker is a main shaft of the circuit breaker.

In an example, the at least one first sensor utilized to obtain the at least one time series sensor data of the at least one first part of the calibration circuit breaker comprises one or more of: acceleration sensor; main shaft angle sensor.

In an example, the at least one second part of the calibration circuit breaker is a moveable contact and/or pushrod of the circuit breaker.

In an example, the at least one second sensor 70 utilized to obtain the at least one time series sensor data of the at least one second part of the calibration circuit breaker comprises one or more of: position sensor; velocity sensor.

In an example, the neural network was trained on the basis of the at least one time series sensor data of the at least one first part of the calibration circuit breaker 50 when the at least first part of the calibration circuit breaker was operating correctly and the at least one time series sensor data of the at least one second part of the calibration circuit breaker when the at least one second part of the calibration circuit breaker was operating correctly.

In an example, the at least one time series sensor data of the at least one first part of the calibration circuit breaker was acquired at the same time as the at least one time series sensor data of the at least one second part of the calibration circuit breaker.

In an example, the at least one sensor 20, 60 utilized to obtain the at least one time series sensor data of the at least one first part of the calibration circuit breaker is the same type or model as the at least one sensor 20 that will be utilized to obtain the at least one time series sensor data of the at least one first part of the operational circuit breaker.

In an example, the at least one sensor utilized to obtain the at least one time series sensor data of the at least one first part of the calibration circuit breaker is located at the same or equivalent at least one location as the at least one sensor that will be utilized to obtain the at least one time series sensor data of the at least one first part of the operational circuit breaker.

Figure 5:
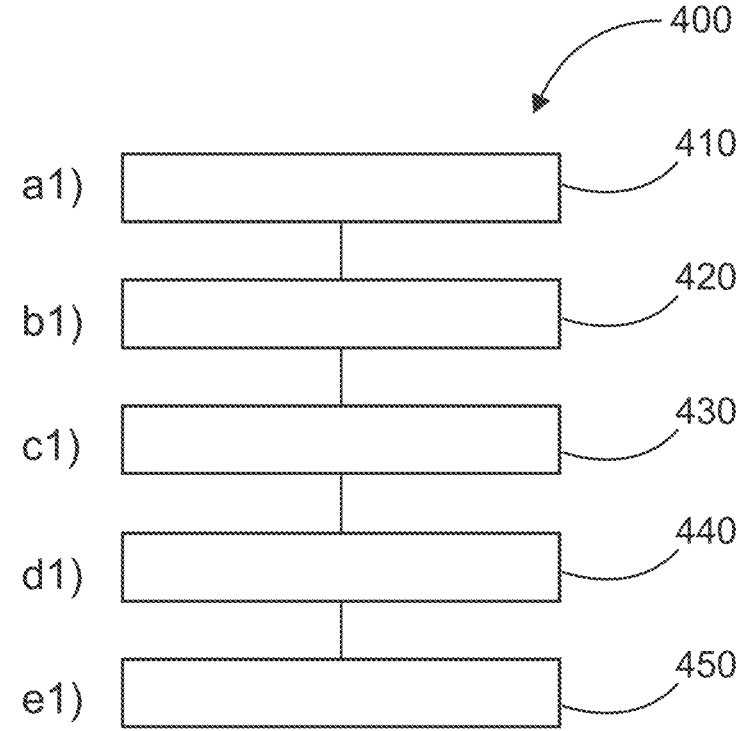
FIG. 5 shows a method for training a neural network for monitoring a circuit breaker.

FIG. 5 shows a method 400 for training a neural network for monitoring a circuit breaker in its basic steps. The method comprises:

> in a utilizing step 410, also referred to as step a1), utilizing at least one first sensor located to obtain at least one time series sensor data of at least one first part of a calibration circuit breaker;

> in a providing step 420, also referred to as step b1), providing the at least one time series sensor data of the at least one first part of the calibration circuit breaker to a processing unit;

> in a utilizing step 430, also referred to as step c1), utilizing at least one second sensor located to obtain at least one time series sensor data of at least one second part of the calibration circuit breaker;

in a providing step 440, also referred to as step d1), providing the at least one time series sensor data of the at least one second of the calibration circuit breaker to the processing unit; and in a training step 450, also referred to as step e1), training by the processing unit a neural network. The training of the neural network comprises utilizing the at least one time series sensor data of the at least one first part of the calibration circuit breaker and the at least one sensor data of the at least one second part of the calibration circuit breaker. The trained neural network is then configured to determine that the at least one second part of an operational circuit breaker is operating correctly or that the at least one second part of the operational circuit breaker has a fault on the basis of analysis of at least one time series sensor data of the at least one first part of the operational circuit breaker. The calibration circuit breaker is the same type or model as the operational circuit breaker.

In an example, the at least one first part of the operational circuit breaker is a main shaft of the circuit breaker.

In an example, the at least one first sensor utilized to obtain the at least one time series sensor data of the at least one first part of the operational circuit breaker comprises one or more of: acceleration sensor; main shaft angle sensor.

In an example, the at least one second part of the operational circuit breaker is a moveable contact and/or pushrod of the circuit breaker.

In an example, the at least one first part of the calibration circuit breaker is a main shaft of the circuit breaker.

In an example, the at least one first sensor utilized to obtain the at least one time series sensor data of the at least one first part of the calibration circuit breaker comprises one or more of: acceleration sensor; main shaft angle sensor.

In an example, the at least one second part of the calibration circuit breaker is a moveable contact and/or pushrod of the circuit breaker.

In an example, the at least one second sensor 70 utilized to obtain the at least one time series sensor data of the at least one second part of the calibration circuit breaker comprises one or more of: position sensor; velocity sensor.

In an example, method comprises training the neural network on the basis of the at least one time series sensor data of the at least one first part of the calibration circuit breaker when the at least first part of the calibration circuit breaker was operating correctly and the at least one time series sensor data of the at least one second part of the calibration circuit breaker when the at least one second part of the calibration circuit breaker was operating correctly.

In an example, method comprises acquiring the at least one time series sensor data of the at least one first part of the calibration circuit breaker at the same time as the at least one time series sensor data of the at least one second part of the calibration circuit breaker.

In an example, the at least one sensor utilized to obtain the at least one time series sensor data of the at least one first part of the calibration circuit breaker is the same type or model as the at least one sensor that will be utilized to obtain the at least one time series sensor data of the at least one first part of the operational circuit breaker.

In an example, the at least one sensor utilized to obtain the at least one time series sensor data of the at least one first part of the calibration circuit breaker is located at the same or equivalent at least one location as the at least one sensor that will be utilized to obtain the at least one time series sensor data of the at least one first part of the operational circuit breaker.

The system for monitoring a circuit breaker, system for monitoring a two or three phase switchgear or controlgear, method for monitoring a circuit breaker, system for training a neural network for monitoring a circuit breaker, and method for training a neural network for monitoring a circuit breaker and now described in specific detail, where reference is made to FIG. 6.

The inventors realized that sequence to sequence (Seq2seq AI models) that have been used for translating one language into another language, could be utilized in a completely different way to monitor a circuit breaker, for example as used in a medium voltage switchgear or controlgear. The inventors realized that an appropriately trained Seq2seq model could be utilized in order to "translate" the information of one sensor to that of another sensor when the two sensor measurements are correlated. Moreover, since these AI models are more accurate for input data that is similar to that which was used in their training, and since usually healthy data is much more readily available, such seq2seq models could be trained to translate the output of one sensor to another using only, or mostly, healthy data, which is much more readily available that faulty data required in training existing AI based equipment monitoring system. Subsequently, one can expect large "translation" errors to correlate with problems in the asset, since the abnormal sensor information would lead to greater "translation" errors. A distance metric can be used to understand if the deviation is large enough to call for an alarm.

This also meant that for example a circuit breaker, where a moveable contact monitoring system is required, but where it is difficult to monitor this in the field directly due to the sensors required and their required locations a new monitoring technique could be utilized. The Seq2seq AI model could be trained based on sensor data that was acquired for a calibration circuit breaker with such sensors directly measuring the movement of the moveable contact and/or pushrod. However, at the same time other sensors are used to monitor the main shaft of the circuit breaker. Here, it is much easier to monitor the main shaft of the circuit breaker in terms of the simplicity of sensors required and also the convenience of their location. The Seq2seq AI model is then trained to accurately translate the main shaft sensor data into the moveable contact and/or pushrod sensor data. For this data generation, the calibration circuit breaker would be confirmed to be operating correctly.

Then, the trained Seq2seq AI model can be used in the field for operational circuit breakers. Here, only sensors that monitor the main shaft are required as an input to the Seq2seq AI model and its output is in effect synthetic sensor data of what a sensor of the moveable contact and/or pushrod would have obtained. This synthetic sensor data can then be compared against database sensor data (for the moveable contact and/or pushrod) for a healthy operating circuit breaker to determine in the synthetic data matches the database data within limits to indicate that the moveable contact and/or pushrod is operating correctly or has a fault.

The above relates to a moveable contact/pushrod of a circuit breaker with respect to one set of sensor data and to a main shaft of the circuit breaker for the other sensors data, but different parts of a circuit breaker could be monitored.

Thus, a new technique is provided to monitor mechanical and electrical failures such as contact ablation for circuit breakers.

FIG. 6 provides an overview work flow of the above described technique. In essence, system records time series data from at least two sensors. The data is fed to a seq2seq model that learns to translate the information of one sensor data to the other sensor data during the training phase. In production, the system is used to continuously provide such translations for data not used during training. If the translation error exceeds a certain level, using some distance metric, an alarm is triggered.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A system for monitoring a circuit breaker, the system comprising:

at least one first operational sensor; and a processor, wherein the at least one first operational sensor is configured to be located and utilized to obtain at least one time series sensor data of at least one first part of an operational circuit breaker, the first part of the operational circuit breaker comprising a main shaft of the operational circuit breaker, wherein the at least one first operational sensor is configured to provide the at least one time series sensor data of the at least one first part of the operational circuit breaker to the processor, and wherein the processor is configured to determine that at least one second part of the operational circuit breaker is operating correctly or that the at least one second part of the operational circuit breaker has a fault, the second part of the operational circuit breaker comprising one of a moveable contact and a pushrod of the operational circuit breaker, wherein the determination comprises analysis of the at least one time series sensor data of the at least one first part of the operational circuit breaker by a trained neural network implemented by the processor, wherein the neural network was trained on a basis of at least one time series sensor data obtained by at least one first calibration sensor associated with at least one first part of a calibration circuit breaker when the at least one first part of the calibration circuit breaker was operating correctly and at least one time series sensor data obtained by at least one second calibration sensor associated with at least one second part of the calibration circuit breaker when the at least one second part of the calibration circuit breaker was operating correctly, and wherein the calibration circuit breaker is a same model as the operational circuit breaker, and wherein the at least one first part of the calibration circuit breaker is a main shaft of the calibration circuit breaker and the at least one second part of the calibration circuit breaker comprises one or more of a moveable contact or a pushrod of the calibration circuit breaker.

2. The system according to claim 1, wherein the first calibration sensor is one or more of an acceleration sensor and a main shaft angle sensor and the second calibration sensor is one or more of a position sensor and a velocity sensor.

3. The system according to claim 1, wherein the at least one time series sensor data of the at least one first part of the calibration circuit breaker was acquired at a same time as the at least one time series sensor data of the at least one second part of the calibration circuit breaker.

4. The system according to claim 1, wherein the at least one first calibration sensor utilized to obtain the at least one time series sensor data of the at least one first part of the calibration circuit breaker was the same model as the at least one first operational sensor utilized to obtain the at least one time series sensor data of the at least one first part of the operational circuit breaker.

5. The system according to claim 1, wherein the at least one first calibration sensor utilized to obtain the at least one time series sensor data of the at least one first part of the calibration circuit breaker was located at a same or equivalent at least one location as the at least one first operational sensor utilized to obtain the at least one time series sensor data of the at least one first part of the operational circuit breaker.

6. The system according to claim 1, wherein the system comprises an outputter configured to output information indicating that the at least one second part of the operational circuit breaker has a fault.

7. The system according to claim 1, wherein the neural network comprises a sequence to sequence model.

8. A second system for monitoring a two or three phase switchgear or control gear, the second system comprising two or three systems according to claim 1, at least one system according to claim 1 for a circuit breaker of each of the two or three phases.

9. The system according to claim 1, wherein the trained neural network is configured to determine at least one synthetic time series sensor data of the at least one second part of the operational circuit breaker, wherein the determination comprises the analysis of the at least one time series sensor data of the at least one first part of the operational circuit breaker by the trained neural network, and wherein the determination that the at least one second part of the operational circuit breaker is operating correctly or that the at least one second part of the operational circuit breaker has a fault comprises a comparison of the at least one synthetic time series sensor data of the at least one second part of the operational circuit breaker with baseline saved data.

10. The system according to claim 9, wherein the processor is configured to determine that the at least one second part of the operational circuit breaker has a fault on the basis that a distance metric between the at least one synthetic time series sensor data of the at least one second part of the operational circuit breaker and baseline saved data is equal to or greater than a threshold value.

11. The system according to claim 9, wherein the baseline saved data comprises at least one time series sensor data of the at least one second part of the operational circuit breaker where the at least one second part of the operational circuit breaker was operating correctly.

12. The system according to claim 11, wherein the baseline saved data comprises at least some of the at least one time series sensor data of the at least one second part of the calibration circuit breaker used in training the neural network and/or at least one synthetic time series sensor data of the at least one second part of the calibration circuit breaker generated by the neural network from at least some of the at least one time series sensor data of the at least one first part of the calibration circuit breaker.

13. A method for monitoring a circuit breaker, the method comprising:

utilizing at least one operational sensor located to obtain at least one time series sensor data of at least one first part of an operational circuit breaker, the first part comprising a first part of the operational circuit breaker and the at least one operational sensor comprising one or more of an acceleration sensor and a main shaft angle sensor;

providing the at least one time series sensor data of the at least one first part of the operational circuit breaker to a processor; and determining by the processor that at least one second part of the operational circuit breaker is operating correctly or that the at least one second part of the operational circuit breaker has a fault, the second part of the operational circuit breaker comprising one of a moveable contact and a pushrod of the operational circuit breaker, wherein the determining comprises analysing the at least one time series sensor data of the at least one first part of the operational circuit breaker by a trained neural network implemented by the processor, wherein the neural network was trained on a basis of at least one time series sensor data obtained by at least one first calibration sensor associated with of at least one first part of a calibration circuit breaker when the at least one first part of the calibration circuit breaker was operating correctly and at least one time series sensor data obtained by at least one second calibration sensor associated with at least one second part of the calibration circuit breaker when the at least one second part of the calibration circuit breaker was operating correctly, and wherein the calibration circuit breaker is a same model as the operational circuit breaker, and wherein the at least one first part of the calibration circuit breaker is a main shaft of the calibration circuit breaker and the at least one second part of the calibration circuit breaker comprises one or more of a moveable contact or a pushrod of the calibration circuit breaker.

14. A system for training a neural network for monitoring a circuit breaker, the system comprising:

at least one first sensor;
at least one second sensor; and
a processor, wherein the at least one first sensor is configured to be located and utilized to obtain at least one time series sensor data of at least one first part of a calibration circuit breaker, wherein the at least one first part of the calibration circuit breaker is a main shaft of the circuit breaker, wherein the at least one first sensor is configured to provide the at least one time series sensor data of the at least one first part of the calibration circuit breaker to the processor, wherein the at least one second sensor is configured to be located and utilized to obtain at least one time series sensor data of at least one second part of the calibration circuit breaker, wherein the at least one second part of the calibration circuit breaker is a moveable contact and/or pushrod of the circuit breaker, wherein the at least one second sensor is configured to provide the at least one time series sensor data of the at least one second part of the calibration circuit breaker to the processor, and wherein the processor is configured to train the neural network, wherein the training of the neural network comprises utilization of the at least one time series sensor data of the at least one first part of the calibration circuit breaker and the at least one sensor data of the at least one second part of the calibration circuit breaker, wherein the trained neural network is configured to determine that at least one second part of an operational circuit breaker is operating correctly or that the at least one second part of the operational circuit breaker has a fault on a basis of analysis of the at least one time series sensor data of the at least one first part of the operational circuit breaker, and wherein the calibration circuit breaker is a same model as the operational circuit breaker, and wherein the neural network was trained on a basis of the at least one time series sensor data obtained by the at least one first sensor associated with the at least one first part of the calibration circuit breaker when the at least first part of the calibration circuit breaker was operating correctly and the at least one time series sensor data obtained by the at least one second sensor associated with the at least one second part of the calibration circuit breaker when the at least one second part of the calibration circuit breaker was operating correctly, wherein the at least one first part of the calibration circuit breaker is a main shaft of the calibration circuit breaker and the at least one second part of the calibration circuit breaker comprises one or more of a moveable contact or a pushrod of the calibration circuit breaker.

15. A method for training a neural network for monitoring a circuit breaker, the method comprising:

utilizing at least one first sensor located to obtain at least one time series sensor data of at least one first part of a calibration circuit breaker, wherein the at least one first part of the calibration circuit breaker is a main shaft of the calibration circuit breaker;

providing the at least one time series sensor data of the at least one first part of the calibration circuit breaker to a processor;

utilizing at least one second sensor located to obtain at least one time series sensor data of at least one second part of the calibration circuit breaker, wherein the at least one second part of the calibration circuit breaker is a moveable contact and/or pushrod of the circuit breaker;

providing the at least one time series sensor data of the at least one second part of the calibration circuit breaker to the processor; and training by the processor the neural network, wherein:

the training of the neural network comprises utilizing the at least one time series sensor data of the at least one first part of the calibration circuit breaker and at least one sensor data of the at least one second part of the calibration circuit breaker, the trained neural network is configured to determine that at least one second part of an operational circuit breaker is operating correctly or that the at least one second part of the operational circuit breaker has a fault on a basis of analysis of at least one time series sensor data of the at least one first part of the operational circuit breaker, and the calibration circuit breaker is a same model as the operational circuit breaker and wherein the neural network was trained on a basis of the at least one time series sensor data obtained by the at least one first sensor associated with the at least one first part of the calibration circuit breaker when the at least one first part of the calibration circuit breaker was operating correctly and the at least one time series sensor data obtained by the at least one second sensor associated with the at least one second part of the calibration circuit breaker when the at least one second part of the calibration circuit breaker was operating correctly, wherein the at least one first part of the calibration circuit breaker is a main shaft of the calibration circuit breaker and the at least one second part of the calibration circuit breaker comprises one or more of a moveable contact or a pushrod of the calibration circuit breaker.

* * * * *